United States Patent [19]

Linder

[11] Patent Number: 4,710,448

[45] Date of Patent: Dec. 1, 1987

[54] METHOD OF FABRICATING ULTRA-THIN FLEX CABLES

[75] Inventor: Jacques F. Linder, Palos Verdes, Calif.

[73] Assignee: Hughes Aircraft Company, Los Angeles, Calif.

[21] Appl. No.: 851,873

[22] Filed: Apr. 11, 1986

Related U.S. Application Data

[63] Continuation of Ser. No. 651,406, Sep. 17, 1984, abandoned.

[51] Int. Cl.⁴ .................................................. G03C 5/00
[52] U.S. Cl. ..................................... 430/314; 430/315; 430/318; 430/319; 156/664; 427/99; 427/209; 427/255.7
[58] Field of Search ............... 430/314, 316, 317, 318, 430/319, 313; 427/99, 255.6, 255.7, 209; 156/664, 630, 632

[56] References Cited

U.S. PATENT DOCUMENTS

| 3,525,652 | 8/1970 | Tanaka | 156/51 |
| 3,589,004 | 6/1971 | Shaheem | 29/625 |
| 4,104,438 | 8/1978 | Angelo et al. | 428/332 |
| 4,371,587 | 2/1983 | Peters | 428/446 |

Primary Examiner—John E. Kittle
Assistant Examiner—José G. Dees
Attorney, Agent, or Firm—M. E. Lachman; A. W. Karambelas

[57] ABSTRACT

A process is disclosed for forming ultra-thin electrical interconnection flex cables. A thin metallic foil ribbon is first coated on one side with a vapor deposited insulating material. The uncoated side of the metallic foil ribbon is then exposed and etched into a plurality of spaced apart conducting lines. The surface of the conducting lines is then coated with a second layer of vapor deposited insulating material. The resulting flex cable is substantially thinner, more flexible and less thermally conductive than flex cables fabricated by previously known techniques.

6 Claims, 6 Drawing Figures

METHOD OF FABRICATING ULTRA-THIN FLEX CABLES

This application is a continuation of application Ser. No. 651,406, filed Sept. 17, 1984, abandoned.

BACKGROUND OF THE INVENTION

1. Field of the Invention

The present invention concerns a method for fabricating ultra-thin electrical interconnection cables having a plurality of individually conducting lines disposed between two layers of insulating material.

2. Description of the Background Art

Numerous types of advanced electronics and electro-optical devices frequently require a large number of electrically conducting interconnections between various internal components such as large scale integrated circuits. These interconnections are frequently accomplished using thin ribbons containing a plurality of thin conducting lines disposed in spaced apart relation between two layers of insulating material. Conducting ribbons of this type commonly have as many as 50 separate conducting lines and are generally referred to as flex cables.

In certain applications, such as those involving cryogenic temperatures or where a large number of photosensitive detectors are densely located within a small focal area, the flex cables employed must be very flexible to facilitate connection to extremely small electronic components and very thin to minimize thermal conductivity and thereby minimize loss of cryogenic coolant.

Very thin flex cables have previously been fabricated by attaching a ribbon of conductive metallic foil to a base layer of polyimide tape such as KAPTON (a trademark of DuPont) coated with a layer of suitable adhesive, etching the thin metallic foil by standard photolithographic processes to form a plurality of separate conducting lines, and then laminating the resulting spaced apart conducting lines with a second layer of polyimide tape, again coated with a suitable adhesive. Flex cables having a minimum thickness of about 0.0023 inches (0.006 cm) have been fabricated using the above methodology even when extremely thin adhesive-backed polyimide tapes are used.

Another method of fabricating thin flex cables is disclosed in U.S. Pat. No. 3,525,652 in which a thin metallic ribbon is repeatedly dipped in a liquid polyimide or similar insulation bath to produce a flex cable having a single broad conducting path and a minimum thickness of about 0.0028 inches (0.007 cm).

There still exists a need for thinner flex cables having improved flexibility and even lower thermal conductivity. Therefore, one object of the present invention is to provide a method of fabricating ultra-thin flex cables of improved flexibility and lower thermal conductivity.

SUMMARY OF THE INVENTION

In accordance with the present invention, there is provided a method for fabricating ultra-thin flex cables having greater flexibility and lower thermal conductivity than previously available in the prior art.

According to the preferred embodiment of the present inventive method, a thin metallic foil is attached to a suitable mounting board and coated with a vapor deposited insulating material. The metallic foil and insulating material coating are then removed from the mounting board and reattached in reversed orientation with the insulating coating contacting the mounting board and the uncoated side of the metallic foil exposed. The metallic foil is then etched to form a plurality of separate conducting lines using standard photolithographic processes. The edges of the conducting lines which are to be used for electrical connections are then masked and a second layer of vapor deposited insulating material is applied to the exposed side of the conducting lines. The resulting structure comprising a plurality of conducting lines disposed between two layers of vapor deposited insulating material is then removed from the mounting board.

By this process a thinner flex cable is produced having greater flexibility and lower conductivity than previously available by prior art fabrication techniques.

The novel features which are believed to be characteristic of the invention, together with further objectives and advantages thereof, will be better understood from the following description considered in connection with the accompanying drawings in which a presently preferred embodiment is illustrated by way of example. It is to be expressly understood, however, that the drawings are for the purposes of illustration and description only and are not intended as a definition of the limits of the invention.

DETAILED DESCRIPTION OF THE INVENTION

Figure 1:
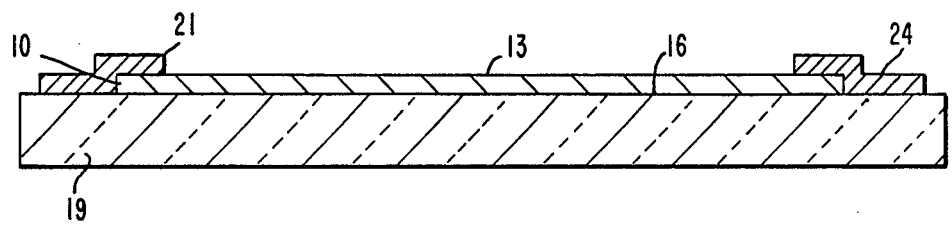
FIG. 1 is an end view of a thin metallic foil attached to a mounting board.

Referring now to the drawings, and more particularly FIG. 1 thereof, there is shown an end view of a thin ribbon of conducting metallic foil 10, having a first surface 13 and a second opposite generally planar surface 16, attached to a mounting board 19. The second metallic foil surface 16 is in contact with the board 19. Any metal of a suitable flexible and conductive nature, such as copper, aluminum, gold, silver, or a metallic compound such as constantan may be used as the metallic foil 10. The mounting board 19 is conventional, may have a generally rectangular shape, and may be made of any rigid substance, such as epoxy-fiberglass, metal, or glass.

Metallic foil 10 is attached to the mounting board 19 in any convenient manner, for example, by using an adequate adhesive tape, such as a known adhesive tape used in metal plating, and which is schematically indicated in FIG. 1 as elements 21 and 24, which have an additional representation indicated below. Alternatively, the mounting board 19 may be provided with suitably configured edge clamps 21 and 24, as shown in FIG. 1.

After attaching the metallic foil 10 to the mounting board 19, a thin coating of insulating material is vapor deposited onto the first metallic foil surface 13. Vapor deposited insulating materials and methods for applying them are well known in the art. PARYLENE (a trademark of Union Carbide) is an example of one well known vapor deposited insulating material. PARYLENE is a random linear copolymer of p-xylenes and is fully described, along with suitable application methods, in U.S. Pat. No. 3,288,728. Another suitable vapor deposited insulating material known in the industry is formed by the PHOTOX process (a trademark of Hughes Aircraft Company) to provide an inorganic oxide, such as silicon dioxide. Materials formed by the PHOTOX process are fully described, along with suitable methods of application, in U.S. Pat. No. 4,371,587. Other similar polymeric and inorganic oxide insulating coatings are also within the scope of this invention.

Vapor deposited insulating materials can generally be applied in significantly thinner coatings than thin film polyimide tape and adhesive combinations. Thin film insulating tapes with an adhesive on one side usually have minimum thicknesses of approximately 0.0010 inches (0.0025 cm) while vapor deposited insulating materials can be applied in satisfactorily electrically insulating coatings as thin as 0.0004 inches (0.001 cm).

Figure 2:
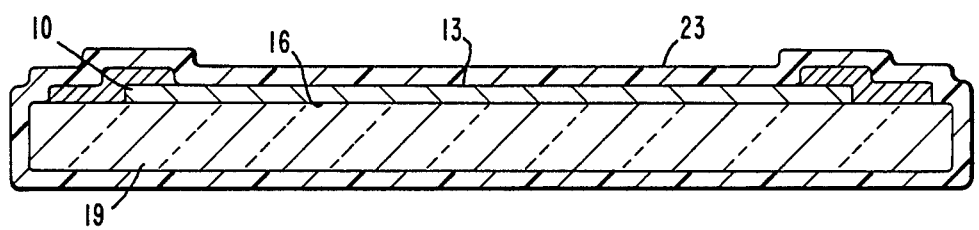
FIG. 2 is an end view of the thin metallic foil and mounting board of FIG. 1, with the metallic foil coated on one side with a vapor deposited insulating material.
Figure 3:
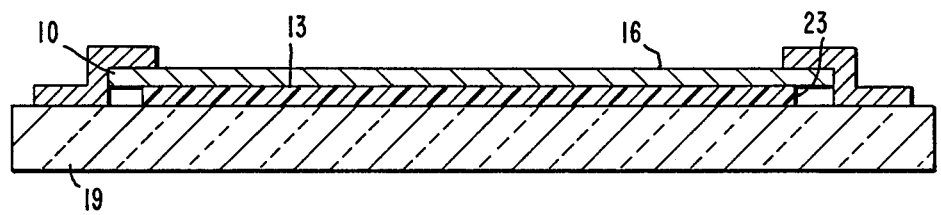
FIG. 3 is an end view of the coated thin metallic foil attached to the mounting board with the uncoated surface of the thin metallic foil exposed.

FIG. 2 shows a representational end view of the metal foil 10 and mounting board 19 after a first layer of vapor deposited insulating material 23 has been applied to the first metallic foil surface 13, as well as the mounting board surfaces. After this first coating, the metallic foil 10 and insulating layer 23 are removed from the mounting board 19, such as by cutting through the insulating layer 23 at the extreme ends of the mounting board and freeing the coated foil 10 from the clamps 21 and 24 or by cutting through the insulating layer 23 and adhesive tapes 21 and 24. Then the coated foil 10 is reoriented, and reattached to the mounting board 19 with adhesive tape or mounting clamps as previously described. As shown in FIG. 3, the metallic foil 10 is reattached to the mounting board 19 with the first insulating layer 23 contacting the mounting board 19 and the second metallic foil surface 16 upwardly exposed.

Figure 4:
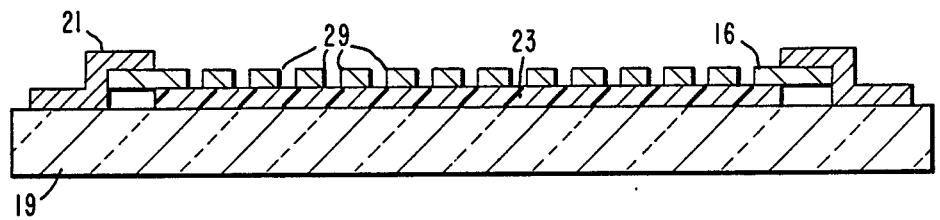
FIG. 4 is an end view of the structure shown in FIG. 3 after the metallic foil has been etched to form a series of individual conducting lines.
Figure 5:
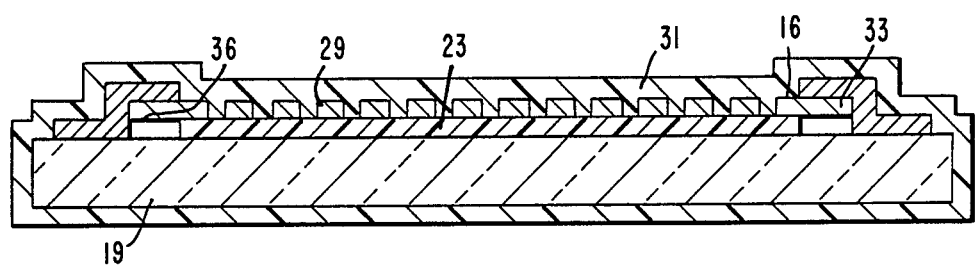
FIG. 5 is an end view of the structure shown in FIG. 4 after coating with a second layer of insulating material.

The metallic foil 10 is then etched to form a plurality of separate conducting lines, generally designated as 29 in FIG. 4, disposed in spaced apart relation over the insulating layer 23. This etching step can be carried out by any number of well known etching processes. Standard photolithographic etching processes, for example, can be used to form a large number of conducting lines of very narrow width and spacing. Typically, photolithographic etching processes can be applied to a 12-inch long metallic foil ribbon to form conducting lines having widths as narrow as approximately 0.002 inches (0.005 cm) with approximately 0.002 inch spacings between adjacent conducting lines. The number of conducting lines photolithographically etched from a metallic foil ribbon is usually dependent upon the length and width of the ribbon. As many as 100 conducting lines could be photolithographically etched from a 12-inch (30 cm) long, 0.5 inch (1.27 cm) wide metallic foil ribbon. Using standard photolithographic etching techniques, precise geometric configurations can be etched into the metallic foil. Thus, the conducting lines can be formed as straight lines precisely located and spaced a predetermined distance apart, or alternatively, formed as a series of lines incorporating various angled turns lying in the plane of the ribbon while still maintaining a precise relationship between adjacent lines. The ends of the ribbon can further be shaped to form configurations well known in the electronics and semiconductor industries, which provide a greater surface area on the ends of each conducting line for more convenient electrical connections.

After forming the conducting lines 29 from the metal foil 10 by etching, the ends of the conducting lines 29 to be used for electrical connecting are masked in any convenient manner. For example, these electrical connecting ends may be simply covered with adhesive tape. If desired, the mounting board 19 may be equipped with suitable masking elements similar to the clamps 21 and 24, disposed so as to cover the electrical connecting ends of the conducting lines 29. Alternatively, the ends of the conducting lines 29 may be left exposed and the subsequent vapor deposited insulating material layers subsequently removed by standard chemical or mechanical processes.

Next, a second coating of vapor deposited insulating material is applied to the exposed second surface 16 comprising the conducting lines 29 to form a second insulating layer 31 completely covering the conducting lines 29, as well as the exposed surfaces of the mounting board 19. The material and method of application are usually, though not necessarily, the same as previously described for forming the first insulating layer 23 on the first surface 13. The material of insulating layer 31 is typically chosen to provide strong adherence to the first insulating layer 23.

Figure 6:
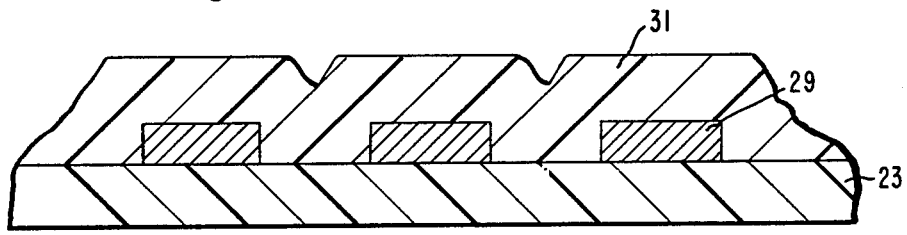
FIG. 6 is a magnified end view of a segment of an ultra-thin flex cable fabricated by the method of the present invention.

The resulting structure of conducting lines 29 having a first insulating layer 23 and a second insulating layer 31 is then removed from the mounting board 19 as previously described. The edges 33 and 36 of the resulting structure are then trimmed by any convenient method to provide an ultra-thin flex cable, a magnified portion of which is shown in FIG. 6, having a plurality of conducting lines 29 imbedded within coatings 23 and 31, respectively, of vapor deposited insulating material.

As yet another alternative, the edges 33 and 36 can be trimmed while the resulting structure is still attached to the mounting board 19. In this manner, removal of the resulting flex cable structure from the mounting board 19 is effectuated by the trimming step. Trimming can be satisfactorily accomplished using any suitable sharp instrument such as, for example, a razor. If desired, a suitable precision die could be fashioned for mass production of ultra-thin flex cables by the present inventive process. Standard well known industrial laser cutting techniques could also be employed.

If, as discussed above, the electrical contacting ends of the ultra-thin flex cable connecting lines were masked before application of the second insulating coatings, the electrical contacting ends will have an insulating layer disposed on only one side. If masks were not employed, insulating layers will cover both opposing sides of the electrical contacting ends. As mentioned above, either or both insulating layers can be removed from the electrical contacting ends by commerically well known chemical or mechanical processes.

In subsequent use, the ultra-thin flex cable can be secured by adhesively bonding the electrical contacting ends to any convenient support structure in close proximity to the electronic component to be interconnected. The single insulating coating disposed on one side of the electrical contacting ends can be used to prevent electrical shorts through the securing support structure by adhesively bonding the coated side of the electrical contacting ends to the support frame. Alternatively, the electrical contacting ends can be attached to various standard connector plugs such as those manufactured by Deutch, Amphenol, and others.

By the present inventive process, ultra-thin flex cables having a minimum thickness of 0.0010 inches (0.0025 cm) or less can be fabricated depending upon the optimum thicknesses of insulating material and the thickness of the original metal foil chosen. Using the above-described inventive process, 0.0010 inch thick ultra-thin flex cables have been fabricated by vapor depositing 0.0004 inch (0.001 cm) thick layers of PARYLENE onto both sides of a 0.0002 inch (0.0005 cm) thick copper foil. In one instance, an ultra-thin flex cable having 20 conductor lines was fabricated from a 10 inch (25.4 cm) long, 0.25 inch (0.635 cm) wide copper foil ribbon. Using conventional photolithographic etching techniques, the conducting lines were each approximately 0.002 inch (0.005 cm) wide and spaced 0.002 inch apart. In another instance, an ultra-thin flex cable was fabricated from a 6 inch (15 cm) long copper ribbon having a 90° or "right-angle" turn in the plane of the ribbon. Again using conventional photolithographic etching techniques, the resulting ultra-thin flex cable had 40 conducting lines, each making the 90° "right-angle" turn and having a width of 0.004 inch (0.01 cm) with 0.004 inch (0.01 cm) spacing between adjacent conducting lines.

As noted above, numerous other suitable metallic foils could be used in place of copper. For smaller ultra-thin flex cables of approximately 0.5 inch (1.3 cm) length, the PHOTOX process could be used to vapor deposit a silicon dioxide or other oxide insulating material. Various other vapor deposited insulating materials, well known in the electronics industry, could be used as well.

Those skilled in the art will perceive other variations and modifications of the above-described process within the intention and scope of the invention. For example, the metallic foil could be replaced with a vacuum deposited metallic film. One would first apply a layer of vapor deposited insulating material onto a mounting board having a non-adherable surface, as is well known in the industry. A metallic film would then be deposited onto the insulating layer by any of several common vacuum metallic evaporation techniques. The remaining process would proceed as described above, i.e. etching the metallic film and applying a second insulating coating. Thus, the invention is not limited to the embodiment described herein; rather, the scope of the invention is defined by the appended claims.

What is claimed is:

1. A method of fabricating an ultra-thin flex cable having a thickness of about 0.0010 inch or less comprising the steps of:
   (a) providing a thin metallic foil having opposing first and second planar surfaces;
   (b) vapor depositing a first insulating layer onto said first planar surface of said conductive metallic foil;
   (c) treating said second planar surface of said metallic foil to form a plurality of spaced-apart conducting lines wherein said first insulating layer supports said spaced-apart conducting lines; and
   (d) vapor depositing a second insulating layer onto said second planar surface of said metallic foil remaining after said treating of step (c) so as to cover said conducting lines and fill the spaces therebetween and form said ultra-thin flex cable including said first and second insulating layers and said spaced-apart conducting lines, and having a thickness of about 0.0010 inch or less.

2. The method of claim 1 wherein said insulating layers are both formed of a polymeric compound.

3. The method of claim 1 wherein said insulating layers are both formed of an inorganic oxide.

4. The method of claim 1 wherein said conducting lines are formed by photolithographic etching.

5. A method of fabricating an ultra-thin flex cable having a thickness of about 0.0010 inch or less comprising the steps of:
   (a) attaching a thin metallic foil to a mounting board to provide a first exposed surface of said metallic foil;
   (b) depositing a first insulating layer onto said first exposed surface of said metallic foil;
   (c) removing said metallic foil from said mounting board to expose a second, uncoated surface of said metallic foil and reattaching said metallic foil to said mounting board with said second, uncoated surface of said metallic foil exposed;
   (d) etching said second surface of said metallic foil to provide a plurality of spaced-apart conducting lines wherein said first insulating layer supports said spaced-apart conducting lines;
   (e) depositing a second insulating layer onto said second exposed surface of said metallic foil remaining after said etching so as to cover said conducting lines and fill the spaces therebetween and form said ultra-thin flex cable including said first and second insulating layers and said spaced-apart conducting lines, and having a total thickness of about 0.0010 inch or less; and
   (f) removing said ultra-thin flex cable from said mounting board.

6. A method of fabricating an ultra-thin flex cable having a thickness of about 0.0010 inch or less, comprising the steps of:
   (a) vapor depositing a first layer of an insulating material onto a mounting board;
   (b) depositing a metallic film onto said first layer of said insulating material;
   (c) etching said metallic film into a plurality of spaced-apart conducting lines wherein said first insulating layer supports said spaced-apart conducting lines;
   (d) vapor depositing a second layer of an insulating material onto said metallic film remaining after said etching so as to cover said conducting lines and fill the spaces therebetween, thereby forming said ultra-thin flex cable having a thickness of about 0.0010 inch or less; and
   (e) removing said ultra-thin flex cable from said mounting board.

* * * * *